United States Patent
Xu et al.

(10) Patent No.: US 10,741,401 B1
(45) Date of Patent: Aug. 11, 2020

(54) SELF-ALIGNED SEMICONDUCTOR GATE CUT

(71) Applicant: INTERNATIONAL BUSINESS MACHINES CORPORATION, Armonk, NY (US)

(72) Inventors: Peng Xu, Santa Clara, CA (US); Kangguo Cheng, Schenectady, NY (US); Ruqiang Bao, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/271,803

(22) Filed: Feb. 9, 2019

(51) Int. Cl.
*H01L 21/28* (2006.01)
*H01L 29/66* (2006.01)
*H01L 21/8234* (2006.01)
*H01L 27/088* (2006.01)

(52) U.S. Cl.
CPC ........... *H01L 21/28123* (2013.01); *H01L 21/823431* (2013.01); *H01L 21/823437* (2013.01); *H01L 27/0886* (2013.01); *H01L 29/66545* (2013.01)

(58) Field of Classification Search
CPC ....... H01L 21/823437; H01L 21/82345; H01L 21/823456; H01L 21/823828; H01L 21/823842; H01L 21/82385; H01L 21/823821; H01L 21/823431; H01L 21/28123–2815; H01L 27/0886
See application file for complete search history.

(56) References Cited

U.S. PATENT DOCUMENTS

| | | | |
|---|---|---|---|
| 8,492,206 B2 | 7/2013 | Zhong et al. | |
| 9,425,288 B2 | 8/2016 | Zhong et al. | |
| 9,679,985 B1 * | 6/2017 | Wu | H01L 29/4991 |
| 9,786,507 B2 | 10/2017 | Anderson et al. | |
| 9,818,836 B1 | 11/2017 | Sung et al. | |
| 10,014,298 B1 | 7/2018 | Zang et al. | |
| 10,037,993 B2 | 7/2018 | Lin et al. | |
| 10,153,209 B1 * | 12/2018 | Xu | H01L 27/0207 |
| 2013/0313646 A1 * | 11/2013 | Shieh | H01L 29/7855 257/365 |
| 2017/0141210 A1 * | 5/2017 | Yang | H01L 29/66795 |
| 2017/0148682 A1 * | 5/2017 | Basker | H01L 21/823431 |
| 2017/0154779 A1 * | 6/2017 | Hsieh | H01L 21/32133 |
| 2017/0154966 A1 | 6/2017 | Huang et al. | |
| 2018/0108770 A1 * | 4/2018 | Cheng | H01L 21/3085 |
| 2018/0182859 A1 * | 6/2018 | Lee | H01L 29/517 |
| 2018/0261514 A1 * | 9/2018 | Xie | H01L 29/66545 |
| 2019/0252268 A1 * | 8/2019 | Xie | H01L 21/823821 |

* cited by examiner

*Primary Examiner* — Zandra V Smith
*Assistant Examiner* — Jeremy J Joy
(74) *Attorney, Agent, or Firm* — Intelletek Law Group, PLLC; Gabriel Daniel, Esq.

(57) ABSTRACT

A semiconductor and a method of creating the same are provided. The semiconductor structure includes a first set of fins and a second set of fins disposed on a substrate. There is a high-k dielectric disposed on top of the substrate and the first and second set of fins. There is a work-function metal disposed on top of the high-k dielectric. There is a pinch-off layer disposed on top of the work-function metal (WFM). There is a first dielectric layer disposed on top of the pinch-off layer. There is a second dielectric material configured as a gate cut between the first set of fins and the second set of fins, wherein the second dielectric material cuts through the nitride, pinch-off, and WFM layers.

20 Claims, 12 Drawing Sheets

SELF-ALIGNED SEMICONDUCTOR GATE CUT

BACKGROUND

Technical Field

The present disclosure generally relates to semiconductor device structures and their methods of manufacture, and more specifically to FinFET architectures.

Description of the Related Art

Performance demand for semiconductor transistors have been steadily increasing while their dimensions have shrunk. In this regard, field effect transistors (FETs) have experienced a substantial increase in performance and a planar miniaturization. Such structures typically include a source, a drain, a channel that is positioned between the source region and the drain region, and a gate positioned above the channel region. Current flow through the device is controlled by controlling a voltage applied to the gate electrode. Ideally, if there is no voltage applied to the gate electrode, then there is no current flow through the device. When an appropriate voltage is applied to the gate electrode, the channel region becomes conductive, and electrical current is permitted to flow between the source region and the drain region through the conductive channel region.

To improve the performance of the FET and to increase its density, the size of the device has been steadily reduced. More specifically, the channel length (i.e., between the drain and the source) has been dramatically reduced over the years, which has substantially improved performance. In some scenarios, the reduced channel length may result in short channel effects, which degrades the threshold behavior of these devices.

To alleviate at least some of the foregoing concerns, Fin Field-Effect Transistors (FinFETs) were developed. In contrast to the planar FET, a FinFET operates as a 3-dimensional structure, where the conducting channel is wrapped by a thin silicon "fin" that forms the body of the device. The thickness of the fin (measured in the direction from source to drain) determines the effective channel length of the device. The wrap-around gate structure provides a better electrical control over the channel, and thus, helps to reduce the leakage current and overcome the short-channel effects.

Within a typical FinFET, the channel between the source and the drain is formed as a raised fin over a substrate. The gate electrode is then formed over the sidewalls and top of the channel. Compared to traditional (planar) FETs, the three-dimensional gate structure associated with the FinFET provides better electrical control over the channel, which helps decrease leakage current and minimize other short-channel effects.

SUMMARY

According to one embodiment, a semiconductor structure includes a first set of fins and a second set of fins disposed on a substrate. There is a high-k dielectric disposed on top of the substrate and the first and second set of fins. There is a work-function metal disposed on top of the high-k dielectric. There is a pinch-off layer disposed on top of the work-function metal (WFM). There is a first dielectric layer disposed on top of the pinch-off layer. There is a second dielectric material configured as a gate cut between the first set of fins and the second set of fins, wherein the second dielectric material cuts through the nitride, pinch-off, and WFM layers.

In one embodiment, the second set of fins comprises two or more groups of fins and there is a third dielectric layer coupled between each group of fins that cuts through part of the first dielectric layer between each group of fins.

In one embodiment, the gate cut is self-aligned.

In one embodiment, the pinch-off layer pinches off at least one pair of adjacent fins in the second set of fins and the pinch-off layer comprises tungsten (W).

In one embodiment, the second dielectric material further cuts through the high-k dielectric to the substrate.

In one embodiment, the gate cut is "T" shaped and substantially vertical in the WFM, pinch-off, and first dielectric layers, except for a top-most portion of the first dielectric layer, which may be nitride.

In one embodiment, the gate cut includes a first width in the high-k dielectric, work-function metal, pinch-off, and a first portion of the first dielectric layers. There is a second width that is wider than the first width, in a second portion of the first dielectric layer, and above the first portion. There is a third width that is narrower than the second width, in a third portion of the first dielectric layer, and above the second portion. There is a fourth width that is wider than the third, second, and first portions of the first dielectric layer, and above the third portion. The third width may be substantially similar to the first width.

In one embodiment, the second set of fins includes two or more groups of fins. There is a dielectric layer, which may be an oxide layer, coupled between each group of fins, which cuts through part of the first dielectric layer between each group of fins.

According to one embodiment, a method of fabricating a semiconductor structure is provided. A first and a second set of fins are provided on a substrate, separated by a first gap. A gate is created for the fins. To that end, a high-k dielectric layer is deposited on top of the fins. A work-function metal layer is deposited on top of the high-k dielectric layer. A pinch-off layer is deposited on top of the work-function metal layer. Subsequently, a first dielectric (e.g., nitride) layer is deposited over the gate. The first gap between the first and second set of fins is filled with a dummy material, such as amorphous silicon (a-Si). A contiguous pillar of the dummy material is selectively grown above the existing dummy material, wherein the contiguous pillar projects above a top, horizontal surface of the first dielectric (e.g., nitride) layer. A second dielectric (e.g., nitride) layer is deposited on top of the horizontal surface of the first dielectric (e.g., nitride) layer up to a top surface of the contiguous pillar. A top surface of the second dielectric (e.g., nitride) layer and the top surface of the contiguous pillar are planarized. A gate cut region is then patterned by masking areas outside the first gap by a mask layer. The contiguous pillar is etched down to the high-k dielectric layer. The mask layer is then removed, as well as the contiguous pillar. The first gap is then filled with a third dielectric material.

In one embodiment, the second set of fins two or more groups of fins and a gap between each group of fins in the second set is smaller than a gap between the first set of fins and the second set of fins.

In one embodiment, the pinch-off layer comprises tungsten (W).

In one embodiment, pinch-off layer pinches off at least one pair of adjacent fins in the second set of fins.

In one embodiment, dummy material is amorphous silicon (a-Si).

In one embodiment, filling the first gap between the first and second set of fins with the dummy material includes depositing a dummy material over the first dielectric (e.g., nitride) layer and using a chemical mechanical polishing (CMP) to remove the dummy material from a top surface of the first dielectric (e.g., nitride) layer but retaining the dummy material in the first gap between the first and second set of fins.

In one embodiment, etching the pillar down to the high-k dielectric includes, in the gate cut region: (i) performing a self-aligned pull out of the contiguous pillar by performing a selective etch of the dummy material; (ii) performing a vertical directional selective nitride etch up to the pinch-off layer; (iii) and performing a vertical directional etch of the pinch-off layer and the work-function metal layer, up to the high-k dielectric layer.

According to one embodiment, a method of fabricating a semiconductor structure is provided. A first and a second set of field effect transistor (FET) fins is provided on a substrate, separated by a first gap. A gate is created for the fins. To that end, a high-k dielectric layer is deposited on top of the fins. A work-function metal layer is deposited on top of the high-k dielectric layer. A pinch-off layer is deposited on top of the work-function metal layer. Subsequently, a first dielectric (e.g., nitride) layer is deposited over the gate. The first gap between the first and second set of fins is filled with a dummy material. This dummy material is converted to a contiguous pillar of an oxide within and above a first gap between the first and second set of fins with a second dielectric material, wherein the contiguous pillar projects above a top, horizontal surface of the first dielectric (e.g., nitride) layer. A top portion of the contiguous pillar is trimmed and a second dielectric (e.g., nitride) layer is deposited on top of the first dielectric (e.g., nitride) layer, up to a top surface of the contiguous pillar. A top surface of the second dielectric (e.g., nitride) layer and the top surface of the contiguous pillar are planarized. A gate cut region is then patterned by masking areas outside the first gap by a mask layer. The pillar is etched down to the substrate, the mask layer is removed, and the first gap is filled with a third dielectric material.

In one embodiment, the second set of fins includes two or more groups of fins and a gap between each group of fins in the second set is smaller than a gap between the first set of fins and the second set of fins.

In one embodiment, the pinch-off layer is tungsten (W). The pinch-off layer pinches off at least one pair of adjacent fins in the second set of fins.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1A:
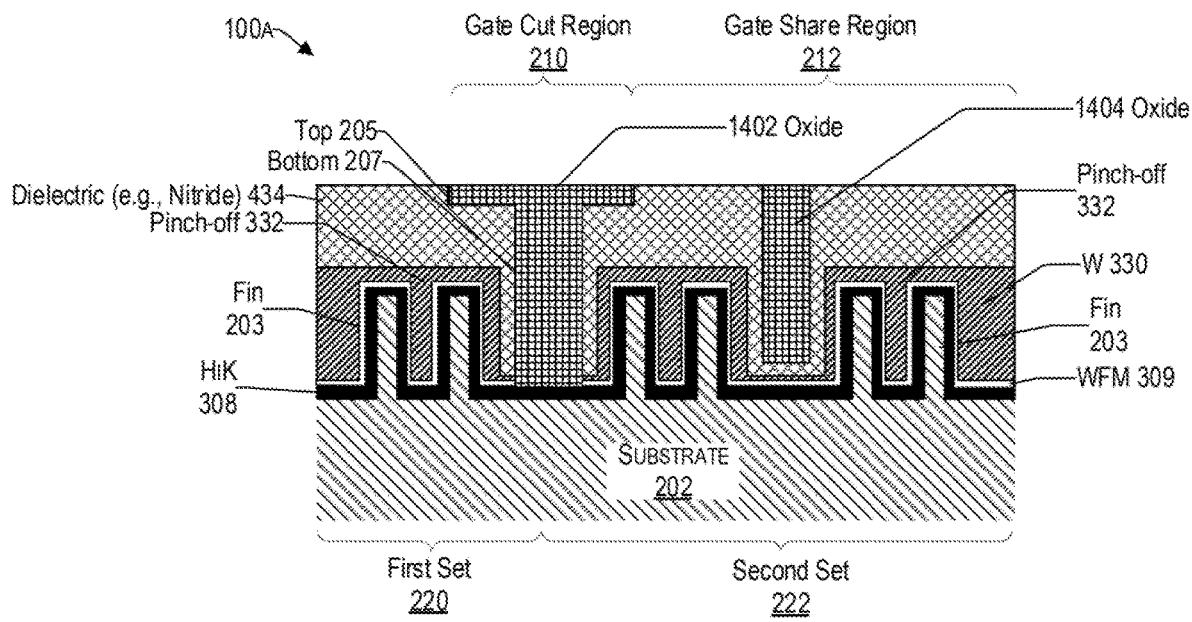
FIG. 1A is simplified cross-section view of a Fin Field-Effect Transistor semiconductor structure having a self-aligned gate cut, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a semiconductor substrate or semiconductor body. For example, substrate can be the surface of a wafer or a die. The term "semiconductor" as used herein denotes any semiconducting material including, for example, Si, Ge, SiGe, SiC, SiGeC, and III-V compound semiconductors such as InAs, GaAs and InP.

As used herein, the term "vertical" describes an orientation that is arranged perpendicular to the first surface of the semiconductor substrate or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure relates to FinFET architectures having a gate cut and methods of manufacturing the same. Today, silicon wafers that include FinFET structures are manufactured in a sequence of steps, each stage placing a pattern of material on the wafer. Such patterning, sometimes referred to as photolithography, masking, oxide or metal removal, or microlithography, is one of the basic steps performed in semiconductor processing. Patterning enables the selective removal of material deposited on a semiconductor substrate, or wafer, as a result of a deposition process. The process of adding layers and removing selective parts thereof, together with other processes, facilitates the fabrication of semiconductor devices. In this way, transistors, contacts, etc., each of which may be made of different materials, are laid down.

For the final device that includes these structures to function properly, these separate patterns should be adequately aligned. Alignment is a salient factor in photolithography and deposition, as well as in other semiconductor processes. If layers are not deposited properly through patterning, or if they are not selectively removed properly, the resulting semiconductor devices may not function adequately. Misalignment, sometimes referred to as an overlay shift, can cause short circuits and connection failures. As semiconductor architectures that include FinFET architectures are scaled down, the gate cut becomes more challenging due to overlay shift. Accordingly, in one aspect, the resulting semiconductor structures discussed herein provide a self-aligned gate cut. As used herein, the term "self-aligned" means that there are no lithography steps involved in the specific layer creation. By virtue of using a self-aligned gate cut, various complicated and costly lithography steps can be avoided, thereby avoiding complicated and costly lithography steps and improving device dimension control. The techniques described herein may be implemented in a number of ways. Example implementations are provided below with reference to the following figures.

Example FinFET Devices

Figure 1B:
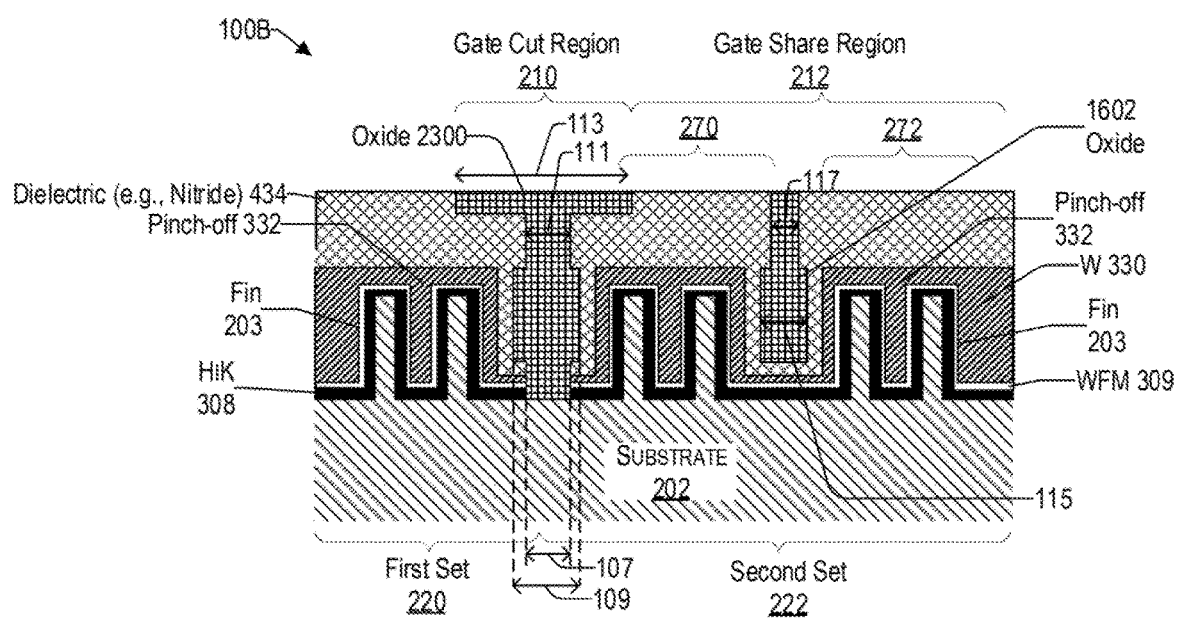
FIG. 1B is simplified cross-section view of an alternative Fin Field-Effect Transistor semiconductor structure having a self-aligned gate cut, consistent with an illustrative embodiment.

Reference now is made to FIGS. 1A and 1B, which are simplified cross-section views of FinFET structures having a self-aligned gate cut, consistent with illustrative embodiments. The semiconductor structures 100A and 100B, representing a vertical field effect transistor (FET), may include a substrate 202. In various embodiments, the substrate 202, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate include, without limitation, sapphire, aluminum oxide, germanium, gallium arsenide (GaAs) or any of the other III-V periodic table compounds, indium phosphide (InP), silicon carbide (SiC), an alloy of silicon and germanium, etc. The substrate 202 can act as a conductor or an insulator, depending on the materials and concentrations chosen. Thus, as used herein, the term substrate 202 refers to a foundation upon which various semiconductor structures can be built.

FIGS. 1A and 1B illustrate a plurality of fins 203 that are separated into a first set of fins 203 and a second set of fins 222 disposed on the substrate 202. The first set of fins 220 is separated from the second set of fins 222 by a gate cut region 210. The second set of fins have a common gate, represented by the gate share region 212. Stated differently, the gate for the second set of fins 222 is common. In the example of FIGS. 1A and 1B, the second set of fins 222 comprise a left group of fins 270 and a right group of fins 272 that share a common gate. For example, a left group may 270 be part of an NFET structure and the right group 272 may be part of a PFET structure, both sharing a common gate.

There is a high-k dielectric 308 formed on top of the substrate 220 and the first and second set of fins 222. There is a work-function metal (WFM) 309 disposed on top of the high-k dielectric 308. In one embodiment, the work-function metal 309 has a thickness of 4 nm.

There is a pinch-off layer 330 deposited on top of the work-function metal 309 having a suitable thickness such as to pinch off at least one pair of adjacent fins (e.g., 270 and/or 272) in the second set of fins 222, as indicated by locations 332. As used herein, the term "pinch off" relates to squeeze in the gate by filling material between gate due to narrow dimensions between fins (e.g., 332). In one embodiment, the pinch-off layer 330 comprises tungsten (W). In this way, adjacent fins (e.g., 270) can be placed together in closer proximity.

There is a dielectric layer 434, referred to herein as a "first dielectric layer" disposed on top of the pinch-off layer 330. In one embodiment, the first dielectric layer 434 is nitride. Further, there is second dielectric material that is different from the first dielectric layer 434 (1402 in FIG. 1A and 2300 in FIG. 1B), in the gate cut region 210, separating the first set of fins 220 and the second set of fins 222. In one embodiment, the second dielectric material is oxide. The second dielectric material cuts through the nitride 434, pinch-off (e.g., W) 330, and the work-function metal 309 layers in the gate cut region 210. In one embodiment, the second dielectric material 2300 further cuts through the high-k dielectric 308 in the gate cut region 210. Significantly, the gate cut provided by the second dielectric material 1402 is self-aligned, as will be discussed in more detail later in the context of the discussion of the manufacturing process.

There is a dielectric material that is different from 434 but can be the same as the second dielectric material (1404 in FIG. 1A and 1602 in FIG. 1B) coupled between each group of fins (e.g., between group 270 and group 272 in the second set 222) that cuts through part of the first dielectric (e.g., nitride) layer 434 between each group of fins but not through the pinch off layer 330, the work-function metal 309, or the high-k dielectric 308. In one embodiment, this dielectric material may be oxide. In this way, a shared (e.g., common) gate is maintained between the left group of fins 270 and the right group of fins 272 in the gate share region 212.

In one embodiment, the gate cut region 210 provided by the second dielectric material layer 1402 is "T" shaped and the second oxide 1404 is substantially rectangular, as illustrated in FIG. 1A. For example, the gate cut 210 is substantially vertical (i.e., perpendicular to the substrate) in the work-function metal 309, pinch-off 330, first dielectric (e.g., nitride) layers 434, except for a top-most portion of the first dielectric (e.g., nitride) layer 434, where the top most portion is wider than the remaining portion of the gate cut 210 provided by the second dielectric material 1402. Stated differently, the gate cut 210 in FIG. 1A comprises a second dielectric material 1402 having a first width in the work-function metal 309, pinch-off 330, and a bottom portion 207 of the first dielectric (e.g., nitride) layer 434, and a second width in the top portion 205 of the first dielectric (e.g., nitride) layer 434, where the second width is wider than the first width, thereby providing a substantially "T" shaped second dielectric material 1402.

In contrast, FIG. 1B illustrates a gate cut region 210 having a different shape to provide additional protection of the pinch off layer 330. More particularly, the gate cut region 210 comprises a second dielectric material 2300 having a first width 107 in the high-k dielectric 308, work-function metal 309, pinch-off 330 and bottom portion of the nitride 434 layers intercepted by the second dielectric material 2300; a second width 109 that is wider than the first width 107 in a second portion of the first dielectric (e.g., nitride) layer 434 that is above the first portion of the first dielectric (e.g., nitride) layer 434; a third width 111 that is narrower than the second width 109, in a third portion of the first dielectric (e.g., nitride) layer 434 that is above the second portion of the first dielectric (e.g., nitride) layer 434; and a fourth width 113 that is wider than the third, second, and first widths, in a fourth portion (sometimes referred to herein as the top portion) of the first dielectric (e.g., nitride) layer 434 that is above the third portion of the first dielectric (e.g., nitride) layer 434. In one embodiment, the third width 111 is substantially similar to the first width 107.

In one embodiment, the second oxide 1602 has a "bottle" shape. More particularly, the second oxide 1602 in the gate share region 212 has a first width 115 in a second portion of the first dielectric (e.g., nitride) layer 434; and a second width 117 that is narrower than the first width 115 for the remaining portions of the first dielectric (e.g., nitride) layer 434 (i.e., the third and fourth portions of the first dielectric (e.g., nitride) layer 434).

By virtue of having a semiconductor structure having a gate cut region 210 with a second dielectric material 2300 and second oxide 1602 as illustrated in FIG. 1B, the probability of the oxide interfering with the pinch-off layer is reduced, thereby producing more reliable semiconductor structures.

Example Processes for FinFET Structures

With the foregoing description of example structures 100A and 100B having FinFET devices, it may be helpful to discuss example processes of manufacturing the same. To that end, FIGS. 2 to 14 illustrate various steps in the manufacture of a semiconductor structure having sets of FinFET devices, similar to that of FIG. 1A, while FIGS. 15 to 21 illustrate various steps in the manufacture of a semiconductor structure having sets of FinFET devices, similar to that of FIG. 1B, consistent with exemplary embodiments.

Figure 2:
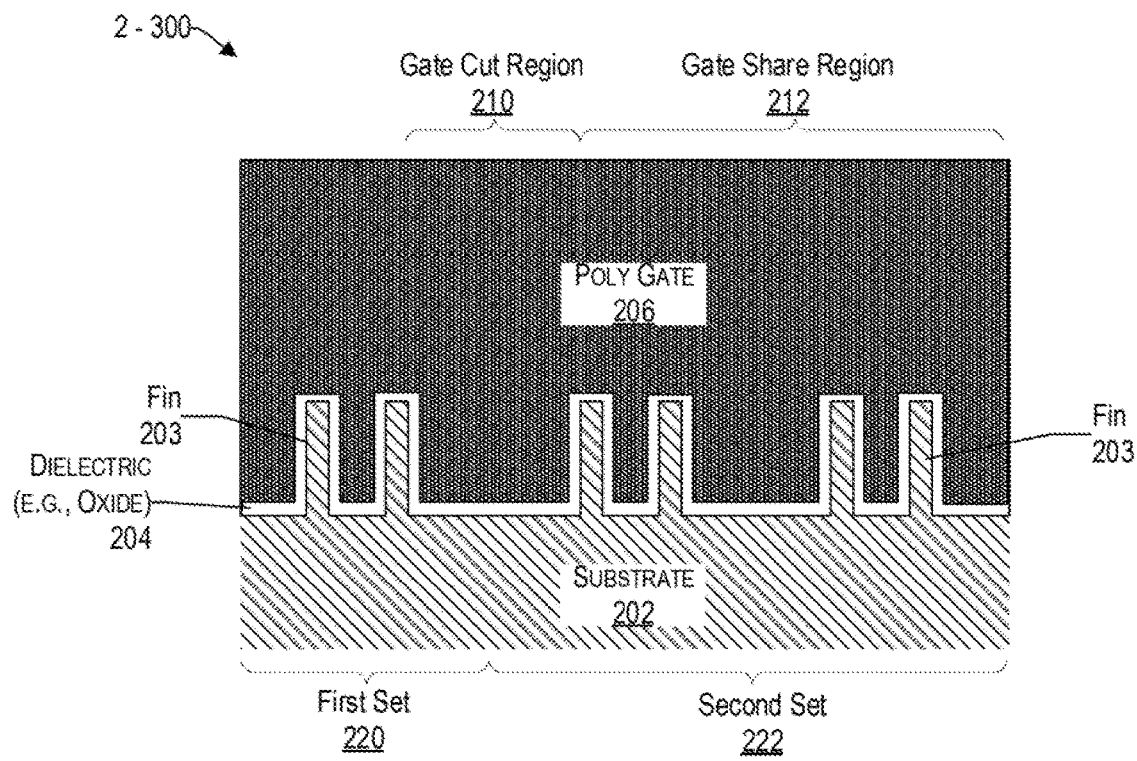
FIG. 2 is a cross-sectional schematic diagram of a semiconductor structure that has undergone some semiconductor processing steps, consistent with an illustrative embodiment.

FIG. 2 is a cross-sectional schematic diagram of a semiconductor structure 200 that has undergone some semiconductor processing steps. In particular, FIG. 2 illustrates an example structure 200 after forming a sacrificial gate layer 206 over a plurality of semiconductor fins 203 disposed on a semiconductor substrate 202. The substrate may comprise any suitable material or combination of materials, such as doped or undoped silicon, glass, etc.

In one embodiment, the substrate may comprise a semiconductor-on-insulator (SOI), e.g., with a buried insulator layer, or a bulk material substrate. The insulator layer (not shown) may comprise any suitable electrical insulator material, such as $SiO_2$, SiN, etc., and may be formed using conventional semiconductor processing techniques, such as thermal oxidation, chemical vapor deposition (CVD), physical vapor deposition (PVD), electrochemical deposition (ECD), atomic layer deposition (ALD), etc.

In one embodiment, there is a thin dielectric layer (e.g., oxide layer) 204 on top of the substrate 202 and the vertical fins 203. The fins 203 include a first set of vertical fins 220 and a second set of fins 222 that are separated by a prospective gate cut region 210. In various embodiments, the dummy gate 206 can be a polysilicon gate (PC).

Figure 3:
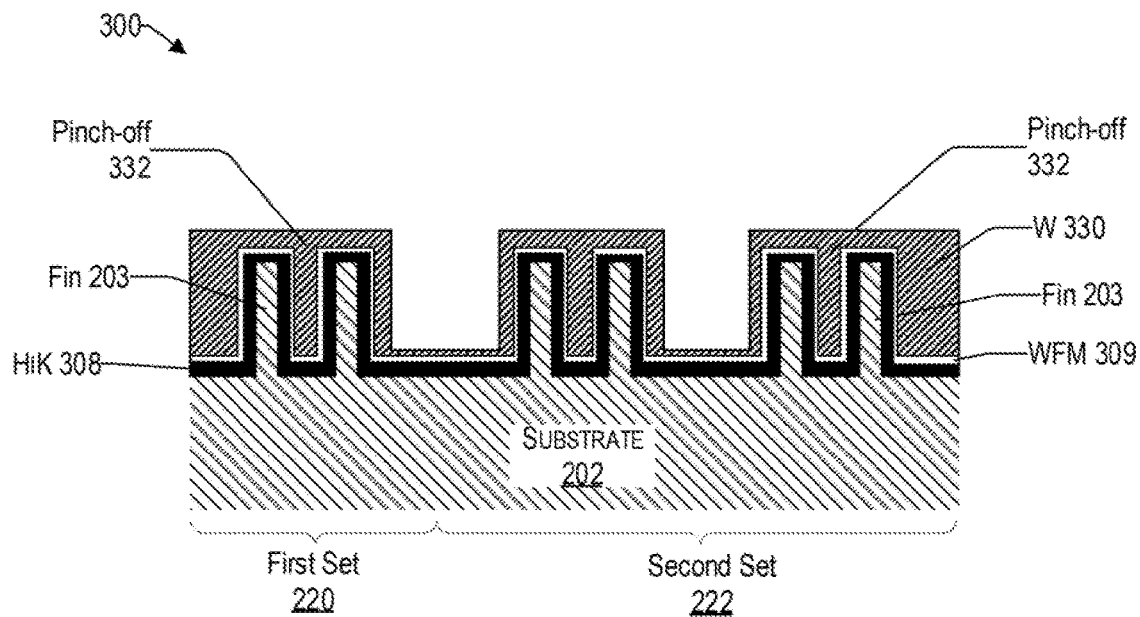
FIG. 3 illustrates a removal of the dummy gate and oxide layers of a semiconductor structure.

FIG. 3 illustrates a removal of the dummy gate 206 and dielectric (e.g., oxide) layers 204 of the semiconductor structure 300. The dummy layer 206 and the oxide layers 204 are removed using known processes, such as etching, stripping, ashing, etc.) to expose the vertical fins 203 for further processing. Instead, a high-k dielectric 308 and a work-function metal (WFM) 309 are deposited on top of the substrate and the fin structures. More particularly, there is a high-k dielectric 308 deposited on top of the substrate 220 and the first and second set of fins 222. There is a work-function metal (WFM) 309 deposited on top of the high-k dielectric 308.

There is a pinch-off layer 330 deposited on top of the work-function metal 309 having a suitable thickness such as to pinch off at least one pair of adjacent fins (e.g., 270 and/or 272) in the second set of fins 222 as indicated by locations 332. In various embodiments, the pinch-off layer 330 of the semiconductor structure 300 may comprise tungsten (W), cobalt (Co), or aluminum (Al). For example, the pinch-offlayer 330 can be blanked deposited using conventional techniques, such as chemical vapor deposition (CVD), plasma enhanced chemical vapor deposition (PECVD), (LP-CVD), atomic layer deposition (ALD), (PEALD), etc. As mentioned previously, the thickness of the pinch-off layer 330 can be based on filling the space between two closely spaced vertical fins to form a sacrificial plug 332, where two portions of the pinch-off layer 330 can coalesce into the sacrificial plug (e.g., 332). The pinch-off layer 330 producing the sacrificial plugs 332 discussed herein provide for closely spaced vertical fins 203 and gate structures formed thereon.

Figure 4:
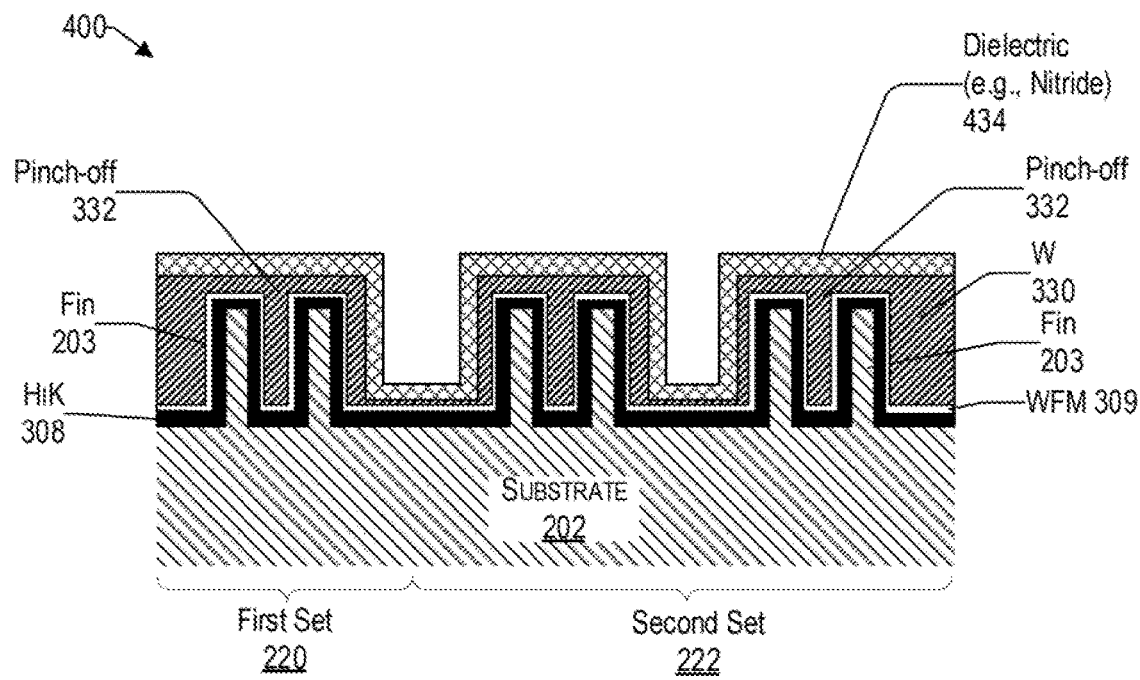
FIG. 4 illustrates a deposition of a nitride liner of a semiconductor structure.

FIG. 4 illustrates a deposition of a dielectric liner 434, sometimes referred to herein as a first dielectric (e.g., nitride) layer. Examples of deposition processes that can be used to form the nitride liner include, without limitation, chemical vapor deposition (CVD), plasma enhanced chemical vapor deposition (PECVD), or atomic layer deposition (ALD).

Figure 5:
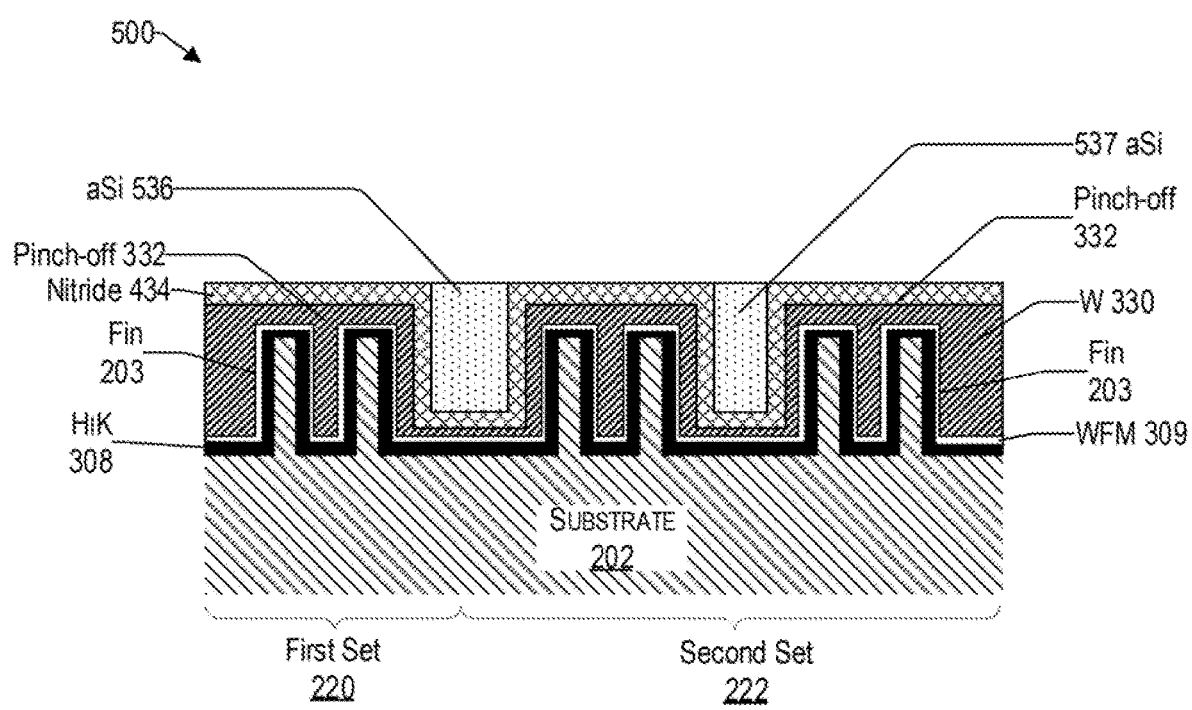
FIG. 5 illustrates a deposition of a dummy material to fill the gaps left behind by a first dielectric layer.

FIG. 5 illustrates a deposition of a dummy material, such as amorphous silicon (a-Si) 536, to fill the gaps left behind by the first dielectric (e.g., nitride) layer 434. The top surface of the semiconductor structure 500 is then planarized using known processes, such as chemical mechanical planarization (CMP).

Figure 6:
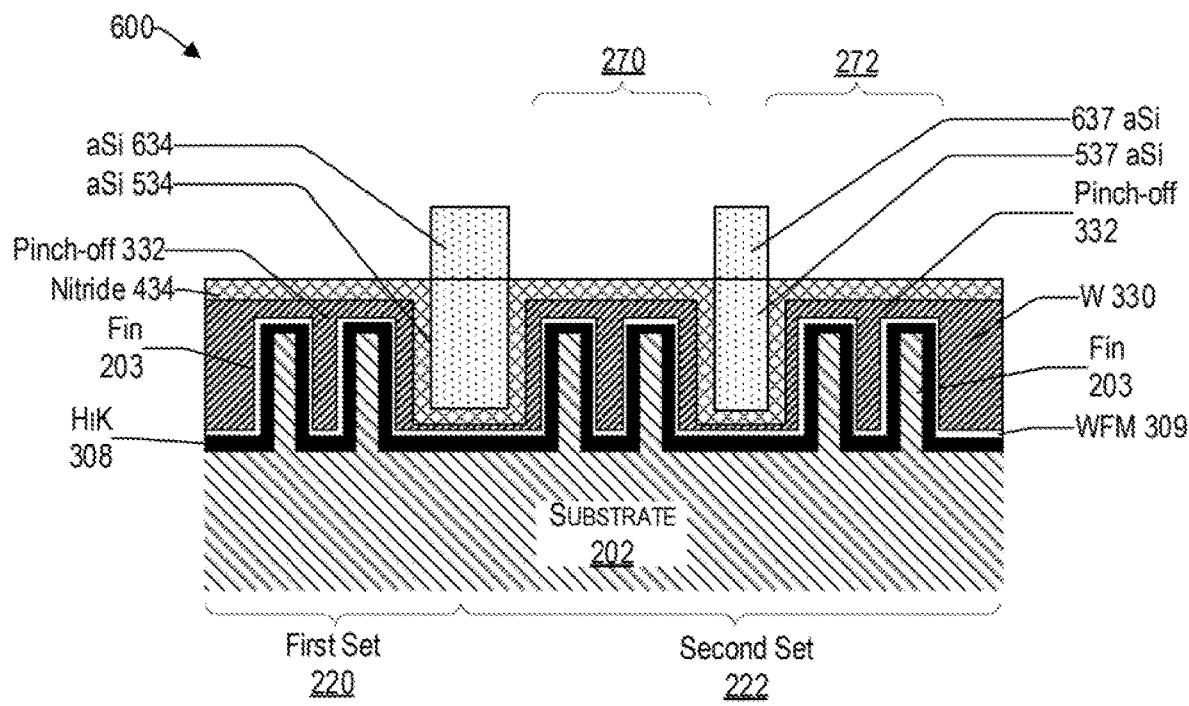
FIG. 6 illustrates a selective deposition of a dummy material on top of an existing dummy material.

FIG. 6 illustrates a selective deposition of a dummy material 634 (e.g., a-Si) on top of the existing dummy material 534. The selective process deposits a layer 637 directly onto the existing dummy material 534 (e.g., a-Si) between the first set 220 and the second set 222 of fins, as well as between the left group 270 and the right group 272 of fins of the second set 222. For example, selectively deposited layers may be formed on semiconductor structure 600 using molecular beam epitaxy or chemical vapor deposition processes. As used herein the terms "selective" refer to deposition of a material on top of another material but not on other types of materials. For example, amorphous silicon is deposited on top of amorphous silicon, but not on oxide, nitride, or metal.

Figure 7:
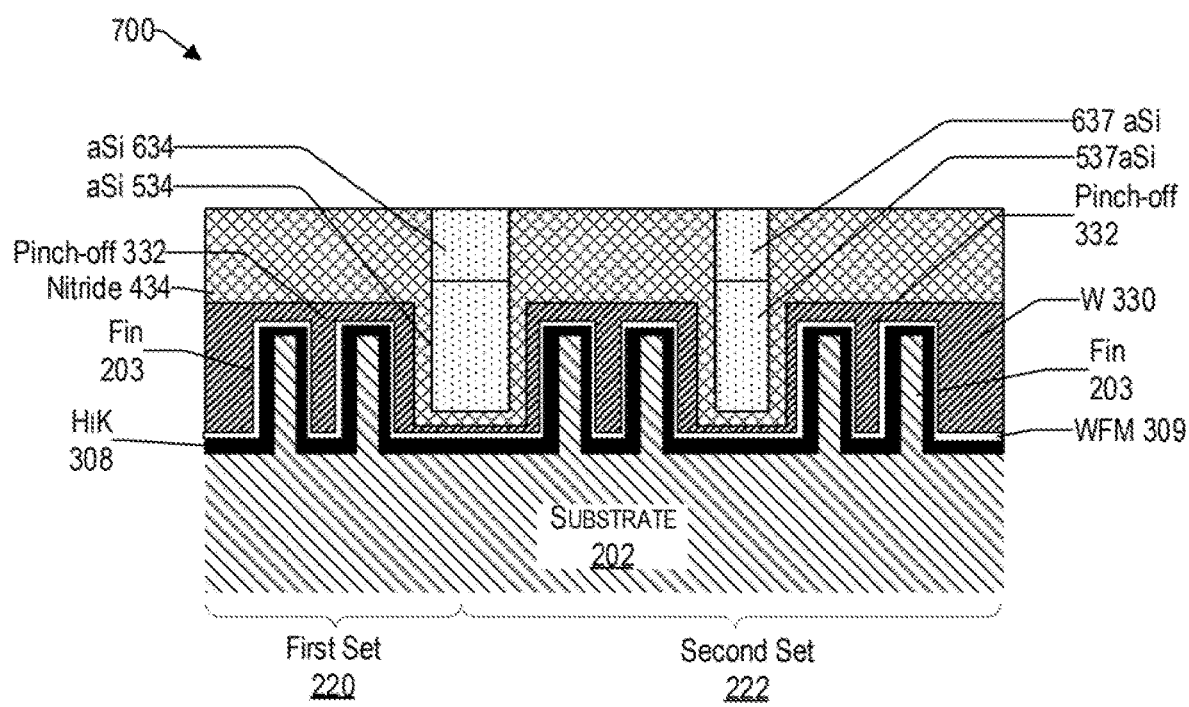
FIG. 7 illustrates a deposition of a nitride fill layer on top of an existing dielectric layer.

FIG. 7 illustrates a deposition of a nitride fill layer on top of the existing nitride 434 layer. It should be noted that nitride is merely an example. Any dielectric material may be used, such, but are not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, or combinations thereof.] The top surface of the semiconductor structure 700 is then planarized using known processes, such as CMP.

Figure 8:
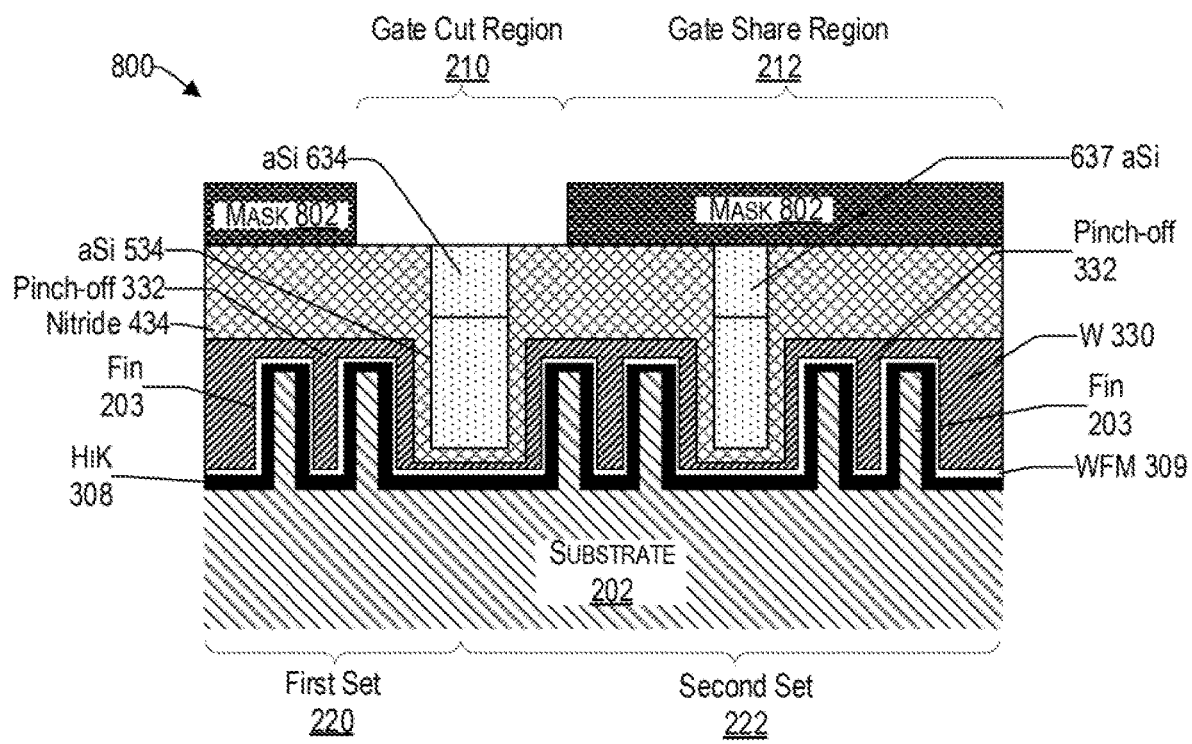
FIG. 8 illustrates a deposition of a mask layer operative to outline a gate cut region of a semiconductor structure.

FIG. 8 illustrates a deposition of a mask layer 802 operative to outline a gate cut region 210 of the semiconductor structure 800, sometimes referred to herein as the gate cut mask 802. The gate cut mask 802 is used to define a gate cut region 210 and cut the gate electrode into a desired pattern. The gate cut mask 802 may comprise a photoresist layer that is deposited over the functional gate structure comprising the first dielectric (e.g., nitride) layer 434, pinch-off layer 330 work-function metal 309 and the high-k dielectric 308. More particularly, the mask 802 is placed on top of the nitride 434 and dummy (e.g., a-Si) 637 layers outside the gate cut region 210. Patterning using conventional lithography is used to create the mask 802. In one embodiment, the photoresist is exposed to a desired pattern of radiation and then, using a resist developer to develop exposed portions of the photoresist, openings are selectively formed in the photoresist layer exposing portions of the functional gate structure that will be removed subsequently. The particular circuit design determines which portions of the functional gate structure are removed to form a gate cut region 210.

Figure 9:
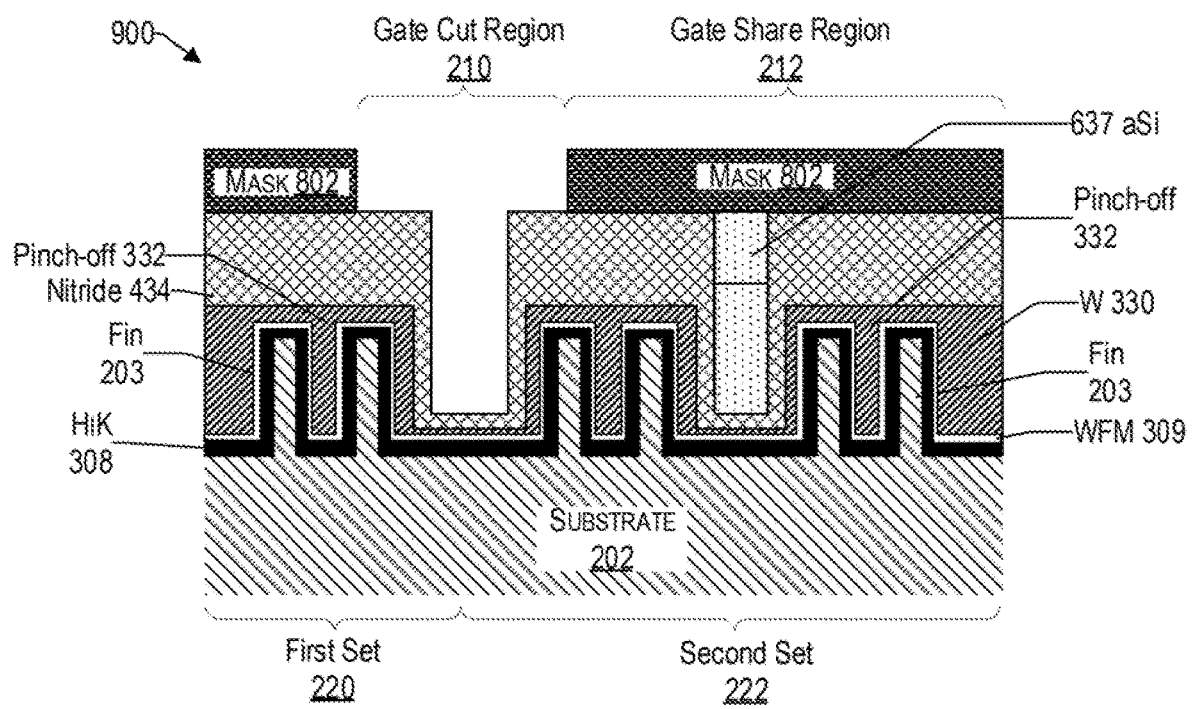
FIG. 9 illustrates a self-aligned pull out of a dummy material that is not protected by a mask.

FIG. 9 illustrates a self-aligned pull out of the contiguous pillar (i.e., dummy material 534 and 634 (e.g., amorphous silicon (a-Si))), which is not protected by the mask 802. For example, there is a selective etch of the a-Si in the gate cut region 210 of the semiconductor structure 900. To that end, a selective etching process, such as a selective reactive ion etch (RIE) and/or wet chemical etch, may be used to form patterns (e.g., openings) by removing the dummy material (e.g., a-Si). For example, a wet etch may comprise ammonia.

Figure 10:
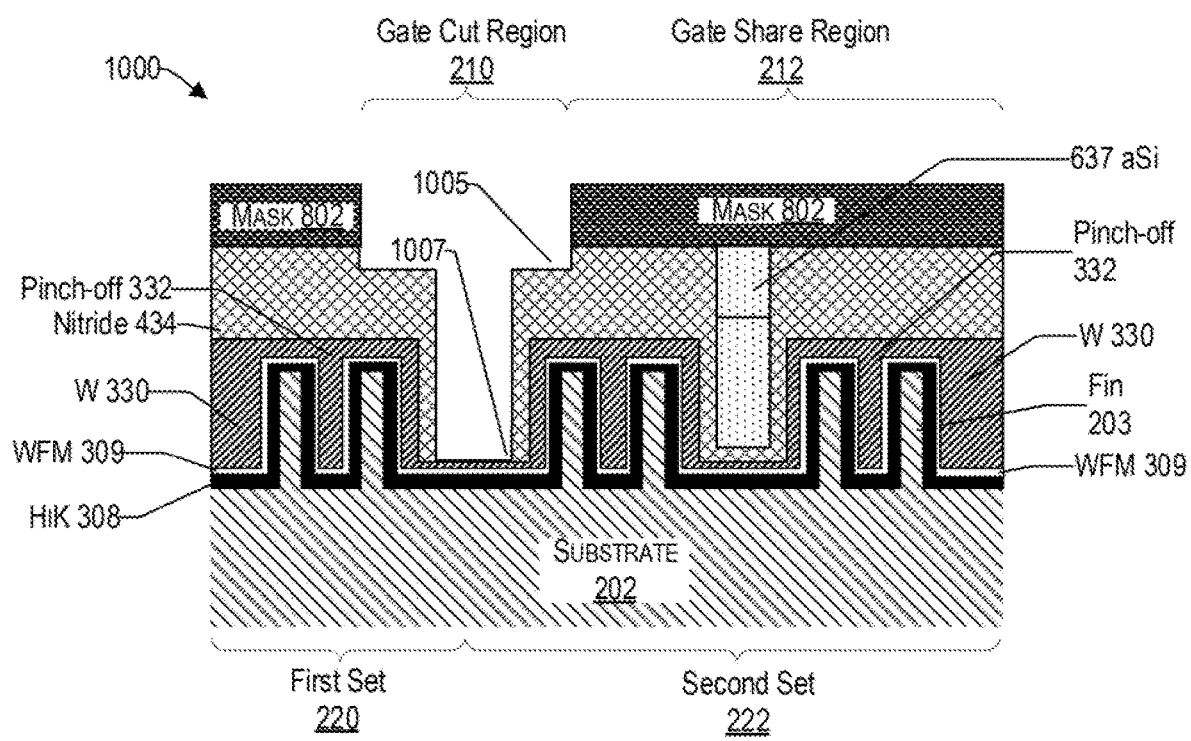
FIG. 10 illustrates a directional nitride etch of the semiconductor structure.

FIG. 10 illustrates a directional nitride etch of the semiconductor structure 1000. More particularly, a top portion 1005, sometimes referred to herein as the fourth portion of the first dielectric (e.g., nitride) layer 434, is vertically etched. Further, the first portion 1007 of the first dielectric (e.g., nitride) layer 434 is etched concurrently. In one embodiment, this is a highly selective etch in that it leaves the underlying material unharmed.

Figure 11:
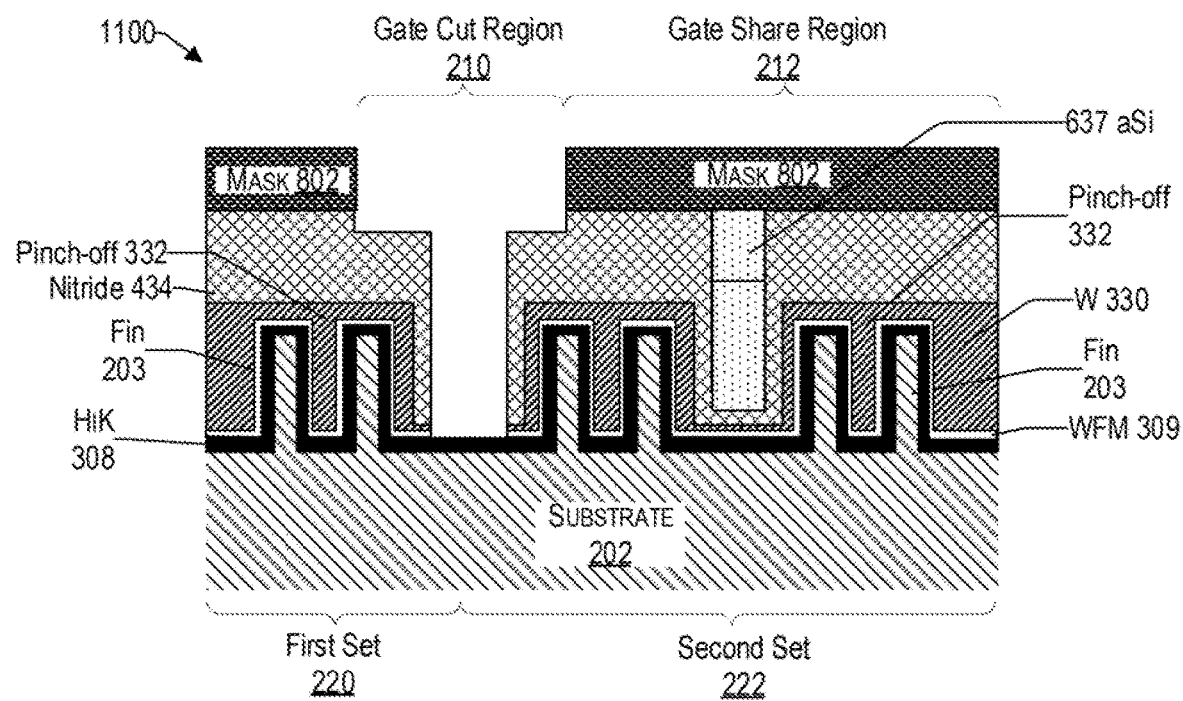
FIG. 11 illustrates a removal of a pinch-off material and a work-function metal layers in a gate cut region that are left exposed by the dielectric layer.

FIG. 11 illustrates a removal of the pinch-off material 330 (e.g., W) and the work-function metal layers 309 in the gate cut region 210 that are left exposed by the first dielectric (e.g., nitride) layer 434. To that end, directional etch is used to remove both of these layers from the semiconductor structure 1100, in a single step. In other embodiments, the pinch-off layer 330 and the work-function metal 309 are removed by way of highly selective separate etching steps.

Figure 12:
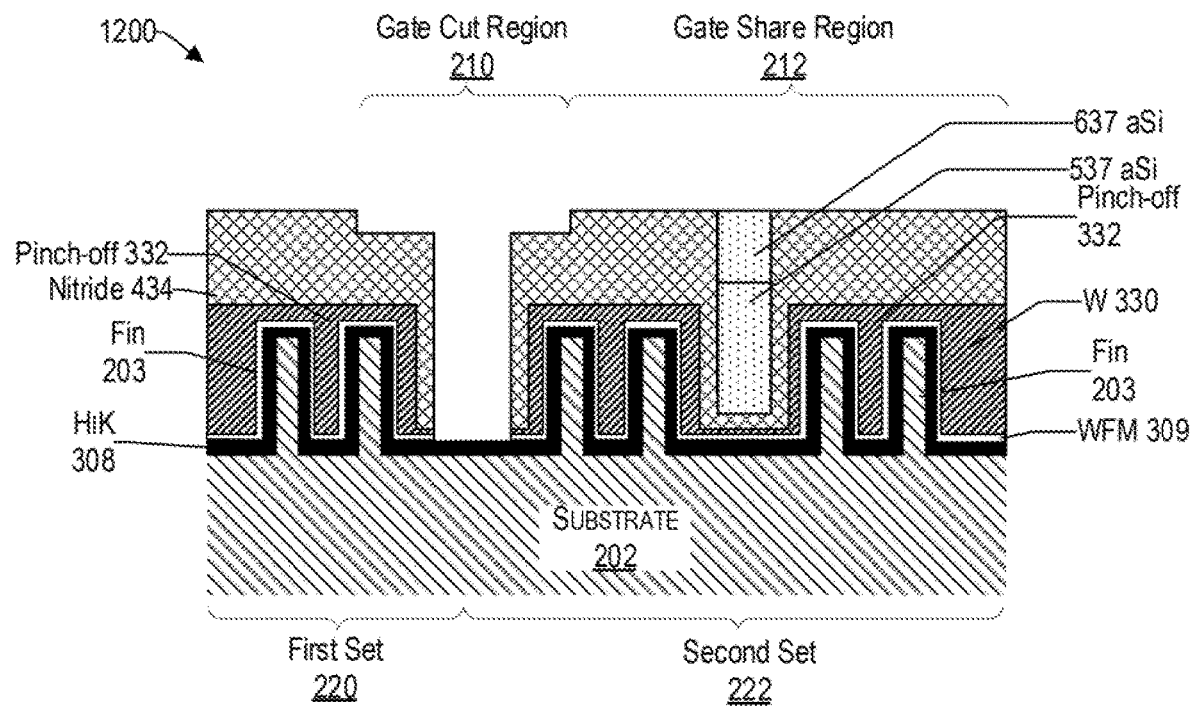
FIG. 12 illustrates a removal of a mask layer a of semiconductor structure.

FIG. 12 illustrates a removal of the mask layer 802 of the semiconductor structure 1200. For example, the mask layer 802 of the semiconductor structure 1200 may be removed using conventional etching, plasma ashing, or stripping processes.

Figure 13:
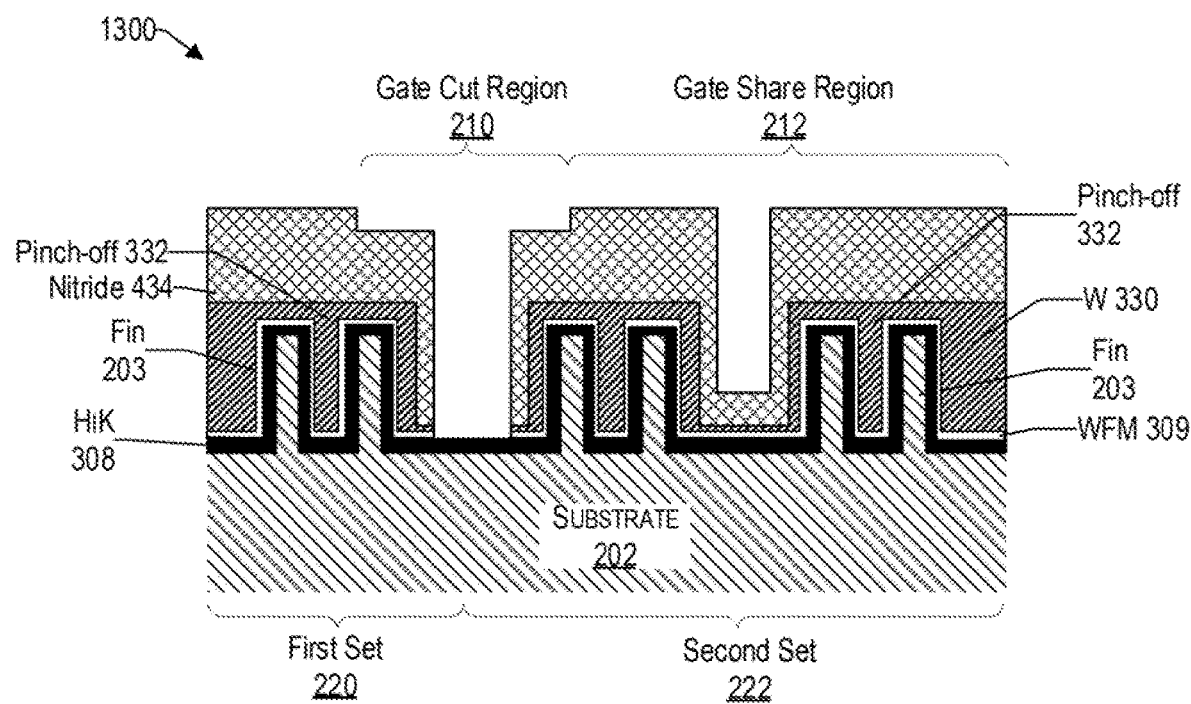
FIG. 13 illustrates a removal of a dummy material from a gate share region.

FIG. 13 illustrates a removal of the dummy material, such as a-Si, 637 and 537 (of FIG. 12) from the gate share region 212. For example, the dummy material (e.g., a-Si) can be removed from the semiconductor structure 1300 by way of a selective etching process, such as a selective reactive ion etch (RIE) and/or wet chemical etch.

Figure 14:
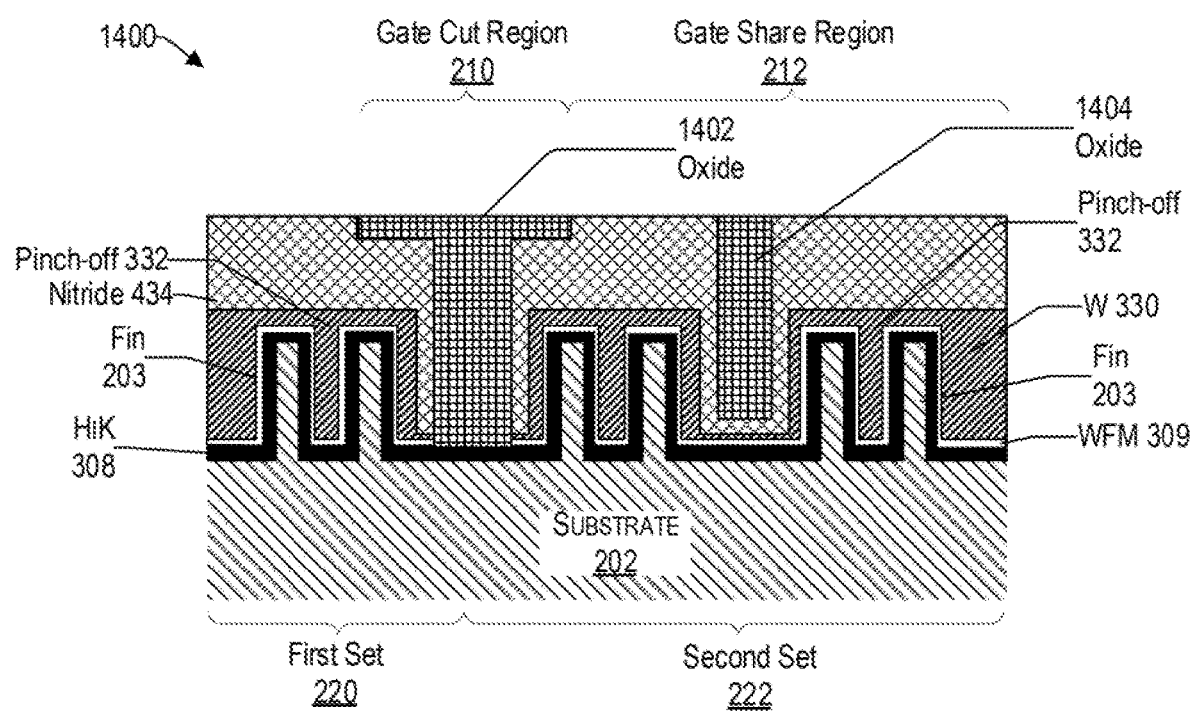
FIG. 14 illustrates a fill layer that is applied to a semiconductor structure to fill in a gate cut region and a gate share region of the semiconductor structure.

FIG. 14 illustrates a fill layer 1402 that is applied to the semiconductor structure to fill in the gate cut region 210 and the gate share region 212 of the semiconductor structure 1400. In various embodiments, oxide or nitride may be used as the fill layer and is applied using a conventional deposition processes, such as a chemical vapor deposition (CVD). The top surface of the semiconductor structure 1400 is then planarized using known processes, such as chemical mechanical planarization (CMP).

In an alternative approach, the patterning process may include a differently shaped gate cut region to provide a semiconductor structure that has additional protection of its gate, and more particularly, of its pinch-off layer. In this regard, reference now is made to FIG. 15, which is substantially similar to FIG. 5, thereby emphasizing that FIGS. 2 to 5 and their corresponding processing steps are substantially similar in the alternative embodiment and are therefore not repeated for brevity.

Figure 15:
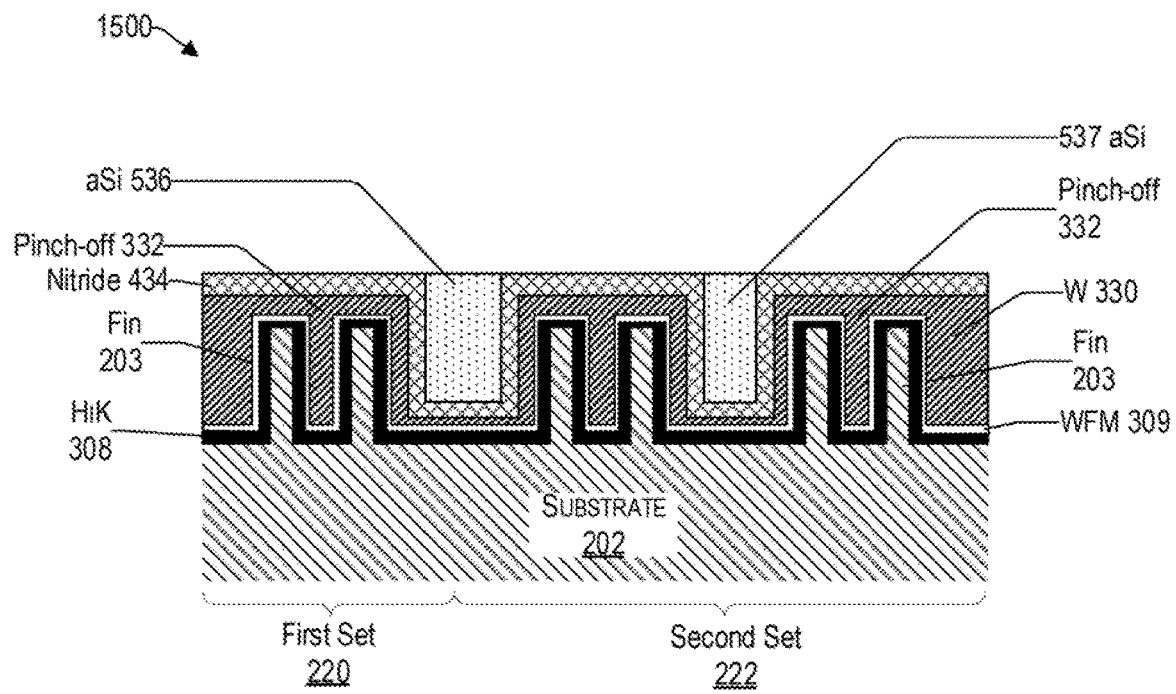
FIG. 15 illustrates a starting environment for an alternative embodiment.
Figure 16:
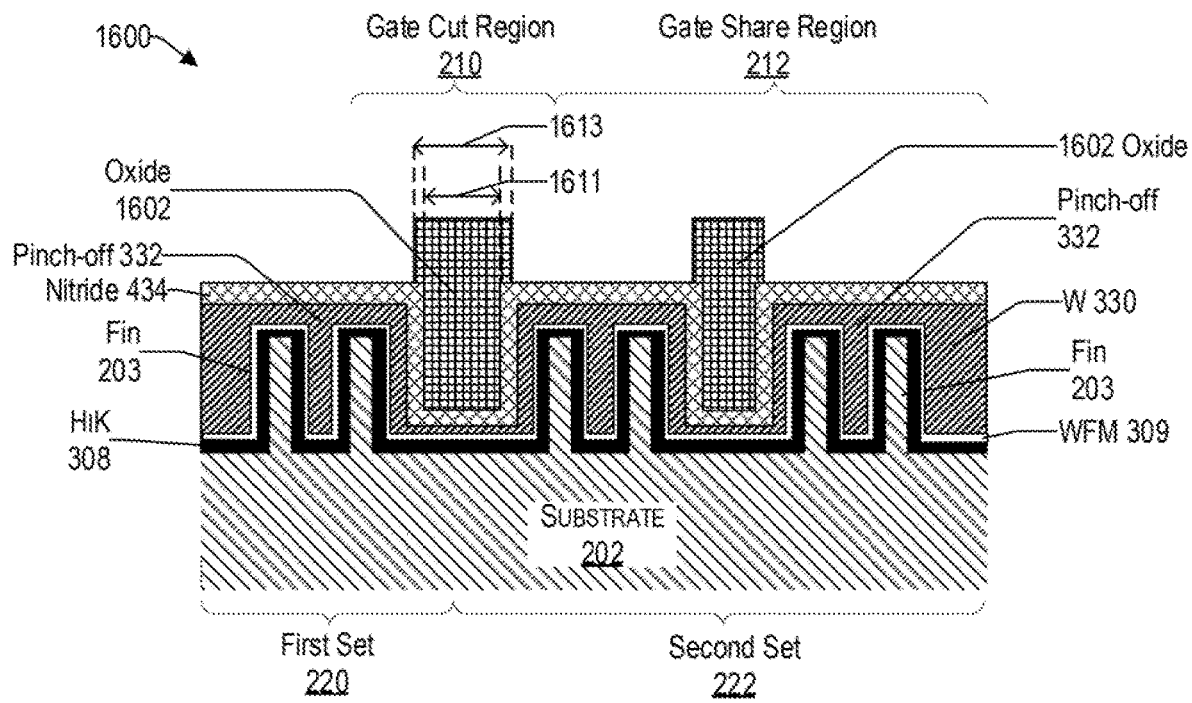
FIG. 16 illustrates conversion of the dummy material into oxide.

FIG. 16 illustrates an oxidation process to convert the aSi 536 discussed in the context of FIG. 15 above, to create the semiconductor structure 1600. The oxidation process causes a volume expansion so that the formed oxide sticks up above the nitride surface. The nitride protects the underlying materials from being oxidized. The oxidation can be a wet oxidation (i.e., oxidation process with water vapor). The width 1611 of the oxide layer 1602 is narrower than the width of the top portion 1613 of the oxide layer 1602 in semiconductor structure 1600. Applicants have determined that continuing the processing of the semiconductor structure 1600 wherein the top portion of the oxide 1602 is wider 1613 than the lower portion 1602 may result in a later thinning of the first dielectric (e.g., nitride) layer 434. In this regard, the oxide is trimmed such that a nitride deposition is made wider in order to provide extra protection for the corners of the work-function metal layer 330 (e.g., W) below, as discussed below in the context of FIG. 17.

Figure 17:
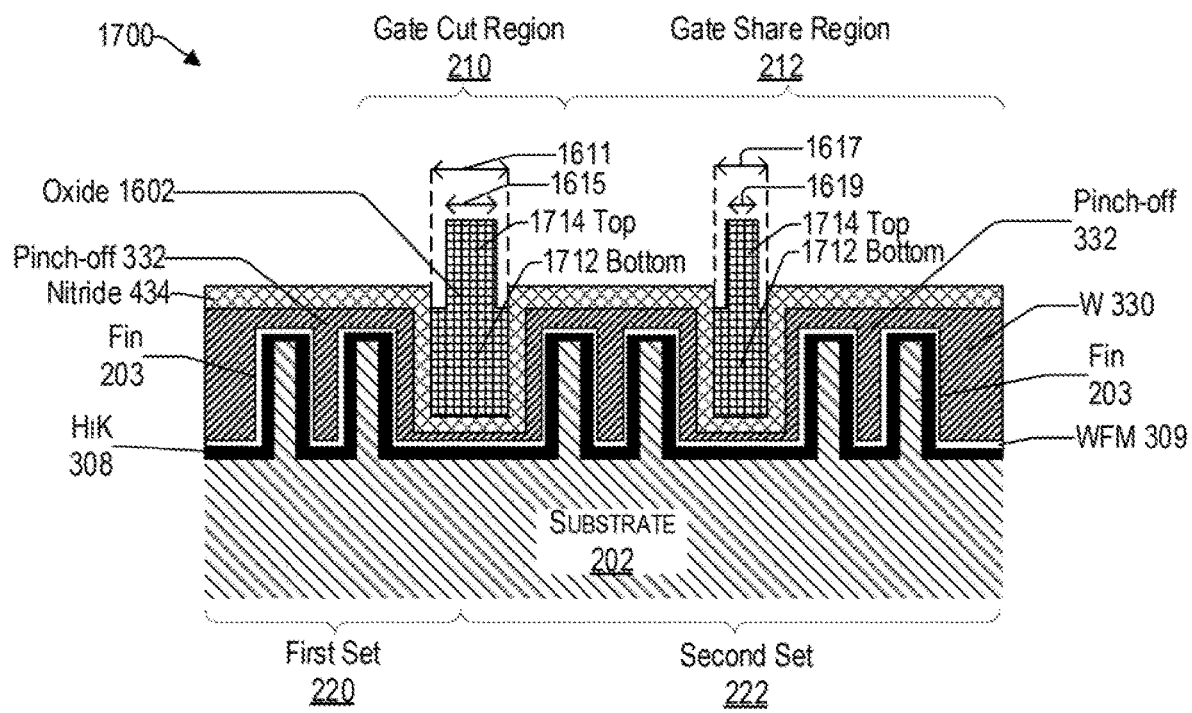
FIG. 17 illustrates a trimming of an oxide layer.

FIG. 17 illustrates a trimming of the top portion of the oxide layer 1602. To that end, anisotropic etch is performed on the oxide layer 1602 such that, in the gate cut region 210, the bottom portion 1712 of the oxide 1602 (having a first width 1611) is narrower than the top portion 1714 (having a second width 1615). Similarly, in the gate share region 212, the bottom portion 1712 of the oxide 1602 having a third width 1617 is narrower than the top portion 1714 having a fourth width 1619. Accordingly, the trimming process can thin the overall width of the top portion of the oxide layer 1602. In some embodiments, the trimming can be provided by a plasma etch using, for example, a reactive ion etch (RIE) or atomic layer etching (ALE) to shape the top portion 1714 of the oxide.

Figure 18:
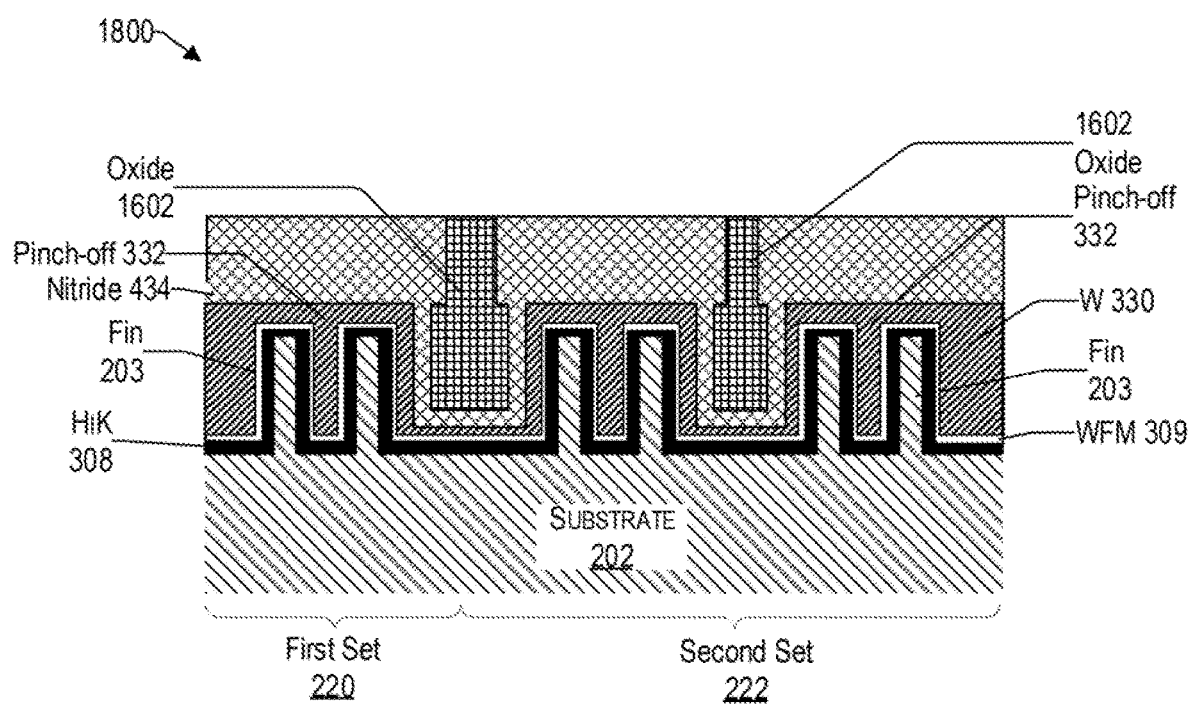
FIG. 18 illustrates a deposition of a nitride fill layer on top of an existing dielectric layer.

FIG. 18 illustrates a deposition of a nitride fill layer on top of the existing nitride 434 layer. The top surface of the semiconductor structure 1800 is then planarized using known processes, such as CMP. It is emphasized that the corners of the pinch-off layer 330 (e.g., W) have additional nitride as compared to the semiconductor structure 700 of FIG. 7. In this way, additional protection is provided for the pinch-off layer 330 from subsequent processes discussed below.

Figure 19:
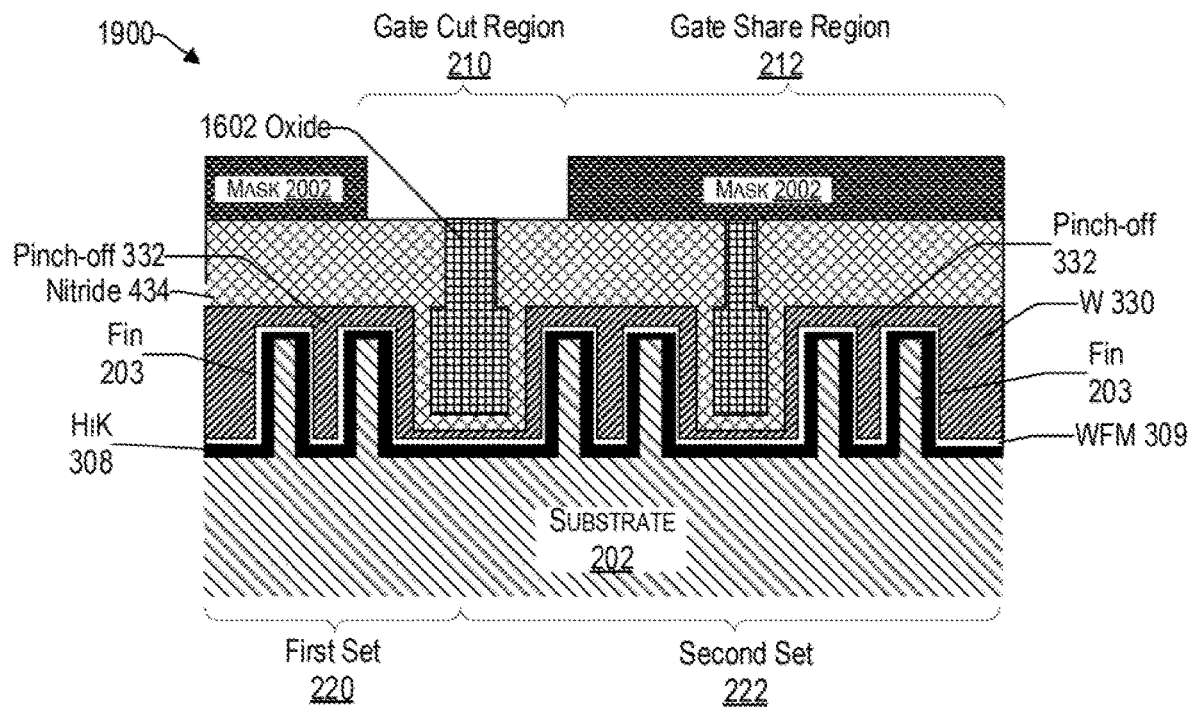
FIG. 19 illustrates a deposition of a mask layer operative to outline a gate cut region of a semiconductor structure.

FIG. 19 illustrates a deposition of a mask layer 2002 operative to outline the gate cut region 210 of the semiconductor structure 1900, sometimes referred to herein as the gate cut mask 2002. The gate cut mask 2002 is used to define a gate cut region 210 and cut the gate electrode into a desired pattern. The gate cut mask 2002 may comprise a photoresist layer that is deposited over the functional gate structure comprising the first dielectric (e.g., nitride) layer 434, pinch-off layer 330, work-function metal 309, and the high-k dielectric 308. More particularly, the mask 2002 is placed on top of the nitride 434 and oxide 1602 layers outside the gate cut region 210. Patterning using conventional lithography is used to create the mask 2002. In one embodiment, the photoresist is exposed to a desired pattern of radiation and then, using a resist developer to develop exposed portions of the photoresist, openings are selectively formed in the photoresist layer exposing portions of the functional gate structure that will be removed subsequently. The particular circuit design determines which portions of the functional gate structure are removed to form a gate cut region 210.

Figure 20:
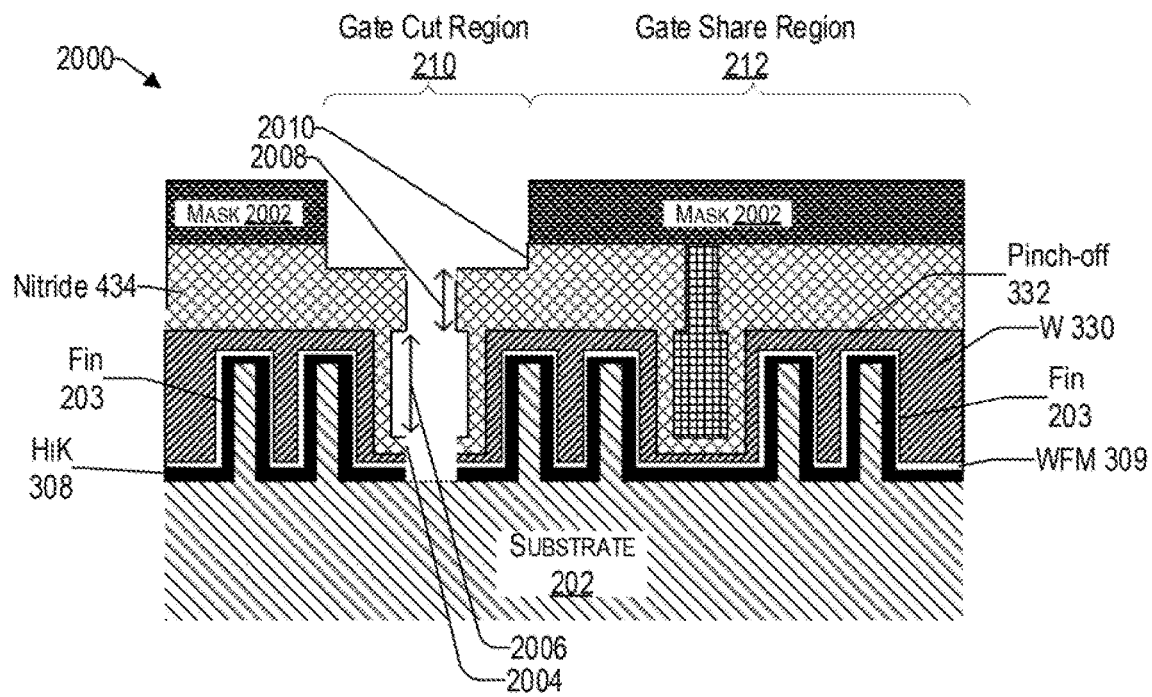
FIG. 20 illustrates a self-aligned pull out oxide, pinch-off, work-function metal, and high-k dielectric layers that are not protected by a mask.

FIG. 20 illustrates a self-aligned pull out the oxide 1602, pinch-off 330, work-function metal 309 and high-k dielectric 308 layers that are not protected by the mask 2002. For example, there is an etch of the oxide 1602 in the gate cut region 210 of the semiconductor structure 2000 by way of a selective etching process, such as a selective reactive ion etch (RIE) and/or wet chemical etch (e.g., hydro-fluoride acid HF), to form patterns (e.g., openings) by removing the oxide material 2002 in the gate cut region 210. Similar selective etch can be performed for the first dielectric (e.g., nitride) layer 434, pinch-off layer 330, work-function metal 309, and high-k dielectric 308, in a single etch step, separate etch steps, or a combination thereof.

For example, semiconductor structure 2000 is depicted as having four nitride 434 regions: namely first 2004 at the bottom, second 2006 in the middle, third 2008 above the pinch-off layer 330, and fourth 2010, which is a top-most layer abutting the mask layer 2002. A directional nitride 434 etch of the semiconductor structure 2000 can be performed after the oxide 1602 etch, by way of a selective vertical etch. More particularly, the fourth portion of the first dielectric (e.g., nitride) layer 434 is vertically etched. Further, the first portion 2004 of the first dielectric (e.g., nitride) layer 434 is etched concurrently. In one embodiment, this is a highly selective etch in that it leaves the underlying material unharmed. A similar selective etch is then performed for the pinch-off 330, work-function metal 309, and high-k dielectric 308 layers in the gate cut region 210 in single or highly selective separate steps.

Figure 21:
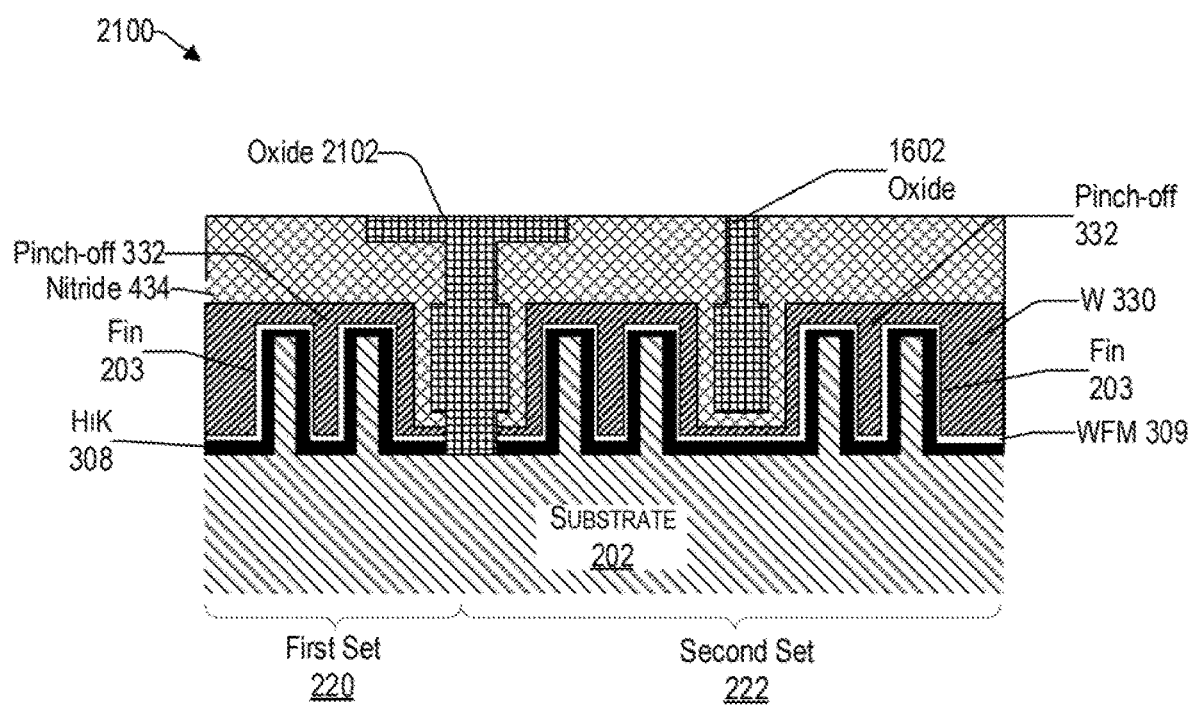
FIG. 21 illustrates a removal of a mask layer and a deposition of a third dielectric layer.

FIG. 21 illustrates a removal of the mask layer 2002 and a deposition of a third dielectric material 2102, which may be oxide. In various embodiments, oxide, carbon doped silicon oxide, fluorine doped silicon oxide, boron carbon nitride, hydrogen silsesquioxane polymer (HSQ), methyl silsesquioxane polymer (MSQ), methyl doped silica, organosilicate glass (SiCOH), SiCN, SiOCN, aluminum nitride, porous SiCOH, or combinations thereof can be used as the dielectric material 2102. For example, the mask layer 2002 of semiconductor structure 2100 may be removed using a conventional etching, plasma ashing, or stripping processes. Subsequently, an oxide fill layer 2300 is applied to the semiconductor structure to fill in the gate cut region 210 of the semiconductor structure 2100. Conventional deposition processes, such as a chemical vapor deposition (CVD) may be used for the oxide fill layer 2102. The top surface of the semiconductor structure 2100 is then planarized using known processes, such as chemical mechanical planarization (CMP).

While the manufacture of semiconductor structures having two sets (i.e., 220 and 222) of FinFET transistors separated by a gate cut have been shown for simplicity, it will be understood that any desired number of sets of FinFET transistors can be formed using similar processing steps concurrently in different parts of a substrate and/or wafer. Further, in various embodiments, different number of FinFETs may be present, based on the particular application of the resulting semiconductor structure.

The method as described above may be used in the fabrication of integrated circuit chips. The teachings herein reduce random misalignment errors, thereby improving the reliability and device performance of the semiconductor structures. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. Example applications or uses to which the present teachings can be applied include, but are not limited to: vertical FinFETs, complementary metal-oxide-semiconductor (CMOS) field effect transistors, digital logic gates (e.g., NAND, NOR, XOR, etc.) and memory devices (e.g., DRAM, SRAM, etc.). The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor structure, comprising:
   a substrate;
   a first set of fins and a second set of fins disposed on the substrate;
   a high-k dielectric disposed on top of the substrate and the first and second set of fins;
   a work-function metal disposed on top of the high-k dielectric;
   a pinch-off layer disposed on top of the work-function metal (WFM);
   a first dielectric layer disposed on top of the pinch-off layer; and
   a second dielectric material configured as a gate cut between the first set of fins and the second set of fins, wherein the second dielectric material cuts through a nitride, pinch-off, and WFM layers, wherein the gate cut comprises:
   a first width in the high-k dielectric, work-function metal, pinch-off, and a first portion of the first dielectric layers;
   a second width that is wider than the first width, in a second portion of the first dielectric layer, and above the first portion;
   a third width that is narrower than the second width, in a third portion of the first dielectric layer, and above the second portion; and
   a fourth width that is wider than the third, second, and first portions of the first dielectric layer, and above the third portion.

2. The semiconductor structure of claim 1, wherein:
   the second set of fins comprises two or more groups of fins; and there is a third dielectric layer coupled between each group of fins that cuts through part of the first dielectric layer between each group of fins.

3. The semiconductor structure of claim 1, wherein the gate cut is self-aligned.

4. The semiconductor structure of claim 1, wherein:
the pinch-off layer pinches off at least one pair of adjacent fins in the second set of fins; and
the pinch-off layer comprises tungsten (W).

5. The semiconductor structure of claim 1, wherein the second dielectric material further cuts through the high-k dielectric to the substrate.

6. The semiconductor structure of claim 1, wherein the gate cut is "T" shaped and substantially vertical in the WFM, pinch-off, and first dielectric layers, except for a top-most portion of the first dielectric layer.

7. The semiconductor structure of claim 1, wherein the third width is substantially similar to the first width.

8. The semiconductor structure of claim 1, wherein:
the second set of fins comprises two or more groups of fins; and
there is an oxide layer coupled between each group of fins, which cuts through part of the first dielectric layer between each group of fins.

9. The method of claim 1, further comprising removing a second contiguous pillar after removing the mask layer to leave a second gap layer.

10. A method of fabricating a semiconductor structure, comprising:
providing a substrate;
providing a first and a second set of fins on the substrate, separated by a first gap;
creating a gate for the fins, comprising:
depositing a high-k dielectric layer on top of the fins;
depositing a work-function metal layer on top of the high-k dielectric layer; and
depositing a pinch-off layer on top of the work-function metal layer;
depositing a first dielectric layer over the gate;
filling the first gap between the first and second set of fins with a dummy material;
selectively growing a contiguous pillar of the dummy material above the existing dummy material, wherein the contiguous pillar projects above a top, horizontal surface of the first dielectric layer;
depositing a second dielectric layer on top of the horizontal surface of the first dielectric layer up to a top surface of the contiguous pillar;
planarizing a top surface of the second dielectric layer and the top surface of the contiguous pillar;
patterning a gate cut region by masking areas outside the first gap by a mask layer;
etching the contiguous pillar down to the high-k dielectric layer;
removing the mask layer; and
filling the first gap with a third dielectric material.

11. The method of claim 10, wherein:
the second set of fins comprises two or more groups of fins; and
a gap between each group of fins in the second set is smaller than a gap between the first set of fins and the second set of fins.

12. The method of claim 10, wherein the pinch-off layer comprises tungsten (W).

13. The method of claim 12, wherein the pinch-off layer pinches off at least one pair of adjacent fins in the second set of fins.

14. The method of claim 10, wherein the dummy material is amorphous silicon (a-Si).

15. The method of claim 10, wherein filling the first gap between the first and second set of fins with the dummy material comprises:
depositing a dummy material over the first dielectric layer; and
using a chemical mechanical polishing (CMP) to remove the dummy material from a top surface of the first dielectric layer but retaining the dummy material in the first gap between the first and second set of fins.

16. The method of claim 10, wherein etching the pillar down to the high-k dielectric comprises, in the gate cut region:
performing a self-aligned pull out of the contiguous pillar by performing a selective etch of the dummy material;
performing a vertical directional selective nitride etch up to the pinch-off layer; and
performing a vertical directional etch of the pinch-off layer and the work-function metal layer, up to the high-k dielectric layer.

17. A method of fabricating a semiconductor structure, comprising:
providing a substrate;
providing a first and a second set of field effect transistor (FET) fins on the substrate separated by a first gap;
creating a gate for the fins, comprising:
depositing a high-k dielectric layer on top of the fins;
depositing a work-function metal layer on top of the high-k dielectric layer; and
depositing a pinch-off layer on top of the work-function metal layer;
depositing a first dielectric layer over the gate;
filling the first gap between the first and second set of fins with a dummy material;
converting the dummy material to a contiguous pillar of an oxide within and above a first gap between the first and second set of fins, wherein the contiguous pillar projects above a top, horizontal surface of the first dielectric layer;
trimming a top portion of the contiguous pillar;
depositing a second dielectric layer on top of the first dielectric layer, up to a top surface of the contiguous pillar;
planarizing a top surface of the second dielectric layer and the top surface of the contiguous pillar;
patterning a gate cut region by masking areas outside the first gap by a mask layer;
etching the pillar down to the substrate;
removing the mask layer; and
filling the first gap with a third dielectric material.

18. The method of claim 17, wherein:
the second set of fins comprises two or more groups of fins; and
a gap between each group of fins in the second set is smaller than a gap between the first set of fins and the second set of fins.

19. The method of claim 17, wherein the pinch-off layer comprises tungsten (W).

20. The method of claim 19, wherein the pinch-off layer pinches off at least one pair of adjacent fins in the second set of fins.

* * * * *